United States Patent [19]

Ochi

[11] Patent Number: 5,091,910
[45] Date of Patent: Feb. 25, 1992

[54] INFORMATION PROCESSING DEVICE

[75] Inventor: Keiichi Ochi, Minoo, Japan

[73] Assignee: Ricoh Company, Ltd., Japan

[21] Appl. No.: 464,387

[22] Filed: Jan. 12, 1990

[30] Foreign Application Priority Data

Jan. 24, 1989 [JP] Japan .................................. 1-14551

[51] Int. Cl.⁵ ............................................ G06F 11/10
[52] U.S. Cl. .................... 371/40.1; 371/21.1; 371/22.5
[58] Field of Search .................. 371/40.1, 40.2, 51.1, 371/53, 54, 21.1, 21.2, 22.5, 19, 25.1; 365/200, 201

[56] References Cited

U.S. PATENT DOCUMENTS

| | | | |
|---|---|---|---|
| 3,778,765 | 12/1973 | Kanter | 271/53 |
| 4,108,359 | 8/1978 | Proto | 371/22.4 |
| 4,493,078 | 1/1985 | Daniels | 371/22.4 |
| 4,530,048 | 7/1985 | Proper | 371/40.1 X |
| 4,612,640 | 9/1986 | Mehrotra | 371/40.1 |
| 4,701,914 | 10/1987 | Matsushita | 371/40.2 X |

*Primary Examiner*—Robert W. Beausoliel
*Attorney, Agent, or Firm*—Mason, Fenwick & Lawrence

[57] ABSTRACT

An information processing device includes a random access memory storing parallel program data, a counter generating a first address supplied to the random access memory and a second address, and a selector for converting the parallel program data read out from the random access memory in accordance with the first address into serial program data when the second address generated by the address generator is applied to the counter. Further, the information processing device includes a circuit for converting the serial program data into a cyclic code signal and outputting the cyclic code signal to an external device in which the cyclic code signal is compared with a reference cyclic signal formed on the basis of correct program data corresponding to the program data stored in the random access memory.

12 Claims, 4 Drawing Sheets

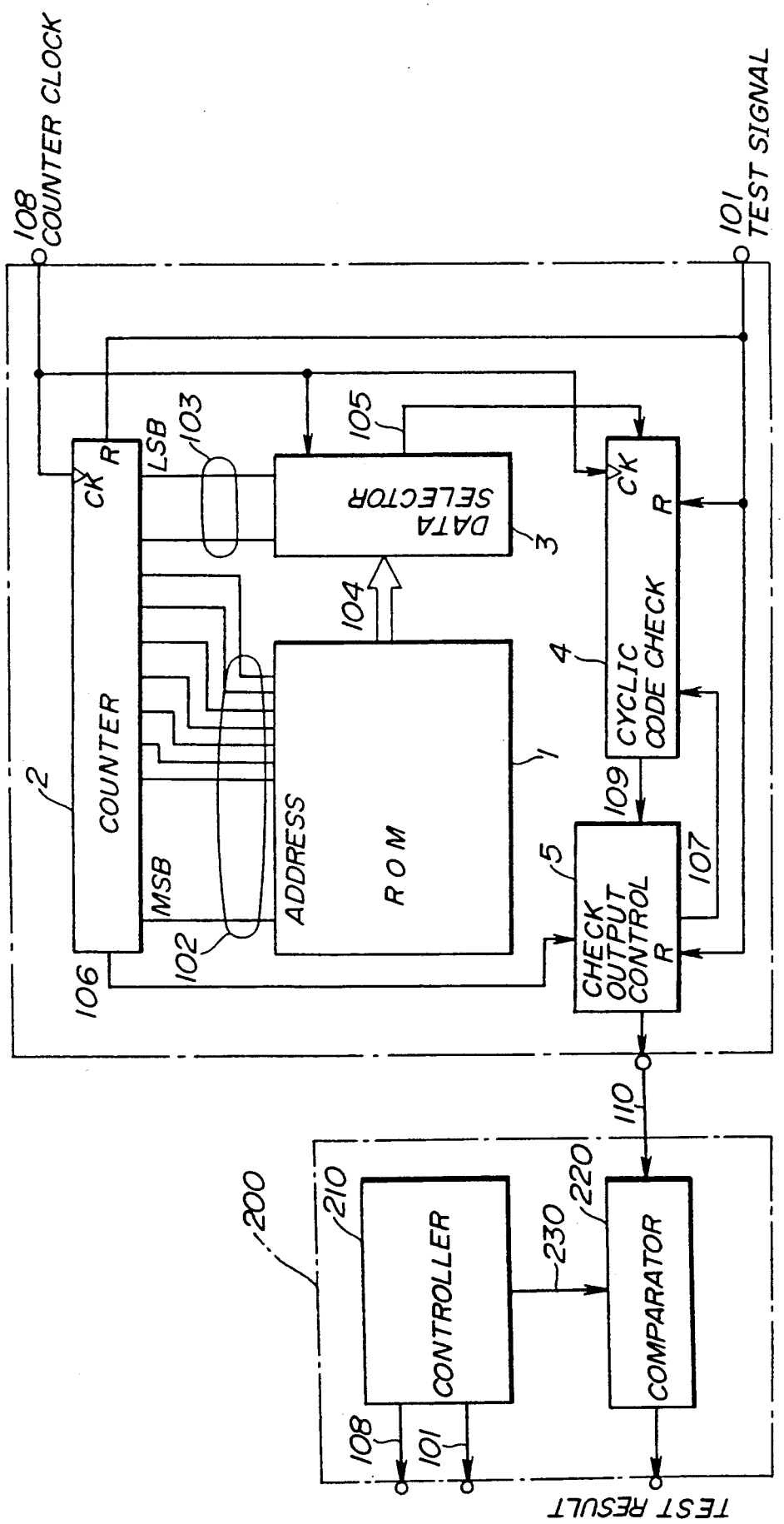

INFORMATION PROCESSING DEVICE

BACKGROUND OF THE INVENTION

The present invention generally relates to an information processing device such as a microcomputer including a read only memory. More particularly, the present invention is directed to an information processing device which has functions of generating a signal used for determining whether the contents of a ROM such as program data have correctly been stored and preventing a third person from reading out or decoding the contents of the ROM.

An information processing device such as a microcomputer equipped with a ROM is widely used. Conventionally, it is required to test a microcomputer as to whether a program has correctly been written into the built-in ROM. For this requirement, there is a need for a means for reading out the contents of the ROM to an external device. In this case, there is a possibility that a third person decodes a stored program from the readout contents of the ROM. From this point of view, normally, a microcomputer is provided with a protection means for preventing a third person from decoding the contents of a ROM.

Japanese Laid-Open Patent Application No. 60-91464 discloses a program readout function which is disabled after reading out the contents of a program memory (ROM) and testing the same. However, there is a need for a specific procedure for disabling the program readout function.

Japanese Laid-Open Patent Application No. 60-83157 discloses a cipher process of shifting or rotating the bit position of readout program data. Japanese Laid-Open Patent Application No. 60-83158 discloses a process of performing a logic AND or OR operation on readout program data. However, there is a possibility that a third person may decode the processed program data with ease, because even when readout program data is processed for every eight bits, the number of possible combinations of conversion is only 256. On the other hand, a complex conversion process increases hardware and is not disable.

SUMMARY OF THE INVENTION

It is a general object of the present invention to provide an improved information processing device in which the above-mentioned objects of the present invention are got rid of.

A more specific object of the present invention is to provide an information control device which has functions of testing the contents of a ROM and preventing a third person from decoding the contents of the ROM by means of simple hardware.

The above objects of the present invention are achieved by an information processing device comprising a random access memory storing parallel program data; address generating means for generating a first address supplied to the random access memory and a second address; first conversion means for converting the parallel program data read out from the random access memory in accordance with the first address into serial program data when the second address generated by the address generating means is applied to the first conversion means; and second conversion means for converting the serial program data into a cyclic code signal and outputting the cyclic code signal to an external device in which the cyclic code signal is compared with a reference cyclic signal formed on the basis of correct program data corresponding to the program data stored in the random access memory.

The above-mentioned objects of the present invention are also achieved by an information processing device comprising a random access memory storing parallel program data; address generating means for generating a first address supplied to the random access memory and a second address; conversion means for converting the parallel program data read out from the random access memory in accordance with the first address into serial program data when the second address generated by the address generating means is applied to the first conversion means; compare means for comparing the serial program data with a reference program data supplied from an external device and outputting a comparison result when the serial program data is not identical to the reference program data; and output means for holding the comparison result until a test mode switching signal is supplied thereto from the external device and for outputting the comparison result when the test mode switching means is supplied.

Additional objects, features and advantages of the present invention will become apparent from the following detailed description when read in conjunction with the accompanying drawings.

BRIEF DESCRIPTION OF THE DRAWINGS

FIG. 2 is a block diagram of a ROM control device built in the information processing device according to a first embodiment of the present invention;

DESCRIPTION OF THE PREFERRED EMBODIMENTS

Figure 1:
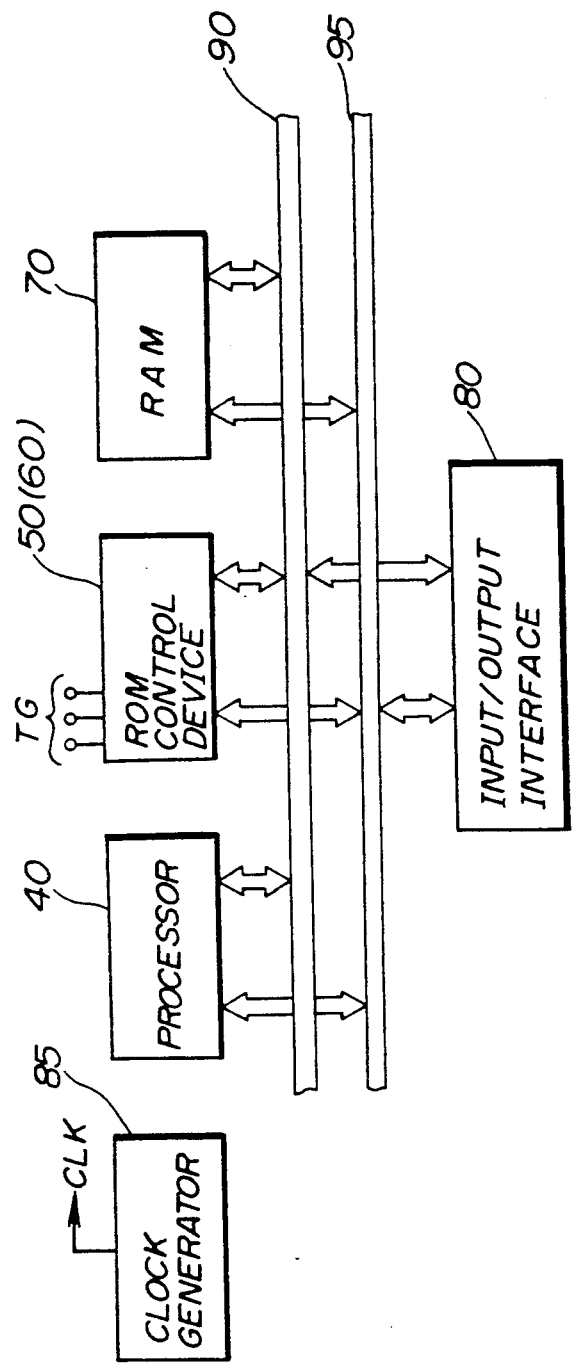
FIG. 1 is a block diagram of an information processing device to which the present invention is applied.

Referring to FIG. 1, there is illustrated an information processing device. The information processing device depicted in FIG. 1 is made up of a processor 40, a ROM control device 50 (60), a random access memory (RAM) 70, and an input/output interface 80, all of which are coupled to an internal address bus 90 and an internal data bus 95. These elements operate in synchronism with a clock signal CLK generated by a clock generator 85.

A description is given of the ROM control device 50 according to the first preferred embodiment of the present invention with reference to FIG. 2. The illustrated ROM control device 50 includes a ROM 1, a counter 2, a data selector 3, a cyclic code check circuit 4, and a check output control circuit 5.

The counter 2 counts a counter clock 108 applied to a clock terminal CK thereof supplied from a controller 210 of a test device 200. When a test signal 101 generated by the controller 210 of the test device 200 is applied to a terminal CK of the counter 2, it outputs an address signal 102 which is composed of n high-order bits among all the address bits derived from the counter 2 where n is an integer. The address signal 102 is supplied to the ROM 1 when it is requested to read out data therefrom. Two low-order bits among all the address bits are supplied, as a data select signal 103, to the data selector 3. The data selector 3 serves as a parallel-to-serial converter and supplies, as serial readout program data 105, parallel program data 104 read out from the ROM 1 to the cyclic code check circuit 4 in accordance with the status of the data select signal 103. The cyclic code check circuit 4 has a readout mode and a check result output mode. Similarly, the check output control circuit 5 has the readout mode and the check result output mode.

In the readout mode, the cyclic code check circuit 4 encodes the serial readout program data 105 and generates a corresponding cyclic code signal, which is supplied, as a coded signal 109, to the check output control circuit 5 in synchronism with the counter clock 108. The check output control circuit 5 is switched to the check result output mode and supplies a control signal 107 to the cyclic code check circuit 4 when the counter 2 overflows and outputs an overflow signal 106. When receiving the control signal 107 from the check output control circuit 5, the cyclic code check circuit 4 is also switched to the check result output mode from the readout mode. In the check result output mode, the cyclic code check circuit 4 neglects the readout data 105 from the data selector 3. The check output control circuit 5 which is in the check result output mode, supplies, as a check output signal 110, the coded signal 109 to a comparator 220 of the test device 200.

Figure 3:
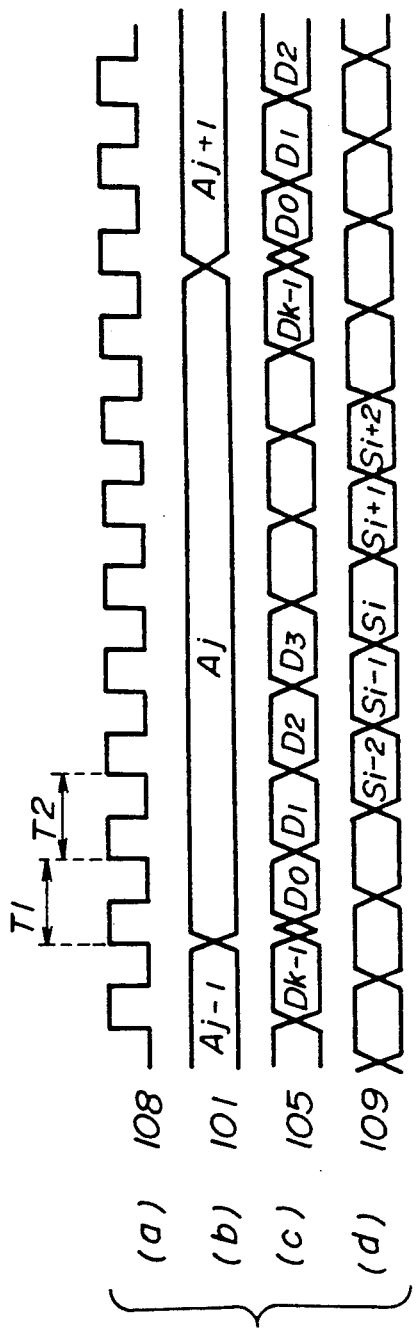
FIG. 3 is a time chart illustrating the operation of the ROM control device shown in FIG. 2.

A description is given of the operation of the configuration shown in FIG. 2 with reference to FIG. 3. The test signal 101 is applied to reset terminals R of the ROM control device 50, the counter 2, the cyclic code check circuit 4 and the check output control circuit 5. Thereby, the ROM control device 50, the counter 2, the cyclic code check circuit 4 and the check output control circuit 5 are initialized. When the counter clock 108 is supplied to the ROM control device 50, the counter 2 is incremented in accordance with the counter clock 108, and the cyclic code check circuit 4 shifts input data by one bit.

It is now assumed that when the address signal 102 from the counter 2 indicates an address Aj of the ROM 2 (FIG. 3), the ROM 1 outputs parallel program data 104 consisting of k bits. The parallel program data 104 is converted into serial readout data 105 labeled $D_0-D_{k-1}$ by the data selector 3. The readout data 105 is successively supplied to the cyclic code check circuit 4 in synchronism with the counter clock 108, and is encoded.

All data stored in the ROM 1 is sequentially read out therefrom by incrementing the address indicated by the address signal 102. When all the stored data is read out from the ROM 1, the counter 2 outputs the overflow signal 106. In response to the occurrence of the overflow signal 106, the check output control circuit 5 and the cyclic code check circuit 4 are switched to the check result output mode. The check output control circuit 5 outputs, as the check output signal 110, the coded signal 109 from the cyclic code check circuit 4 to the comparator 220 of the test device 200. The controller 210 outputs a reference check output signal 230 at the same timing as the check output signal 110 is supplied from the ROM control device 50. The controller 210 has a ROM (not shown) which stores correct program data corresponding to the program data stored in the ROM 1. In addition, the controller 210 has a counter, a data selector, a cyclic code check circuit and a check output control circuit which correspond to the counter 2, the data selector 3, the cyclic code check circuit 4 and the check control circuit 5 of the ROM control device 50, respectively. Alternatively, the controller 210 may store the reference check output signal beforehand. The comparator 220 compares the check output signal 110 with the reference check output signal 230, and determines whether the program has correctly been stored in the ROM 1.

Since the coded signal 109 is scrambled data of the program data stored in the ROM 1, it is impossible to restore the original program data from the coded signal 109. Thus, a third person cannot decode the program data from the check output signal 110.

Generally, the access time to the ROM 1 is longer than the switching time of the data selector 3 and the processing time of the cyclic code check circuit 4. From this point of view, as shown in FIG. 3, it is preferable that a period T1 be determined based on the access time to the ROM 1, and a period T2 is determined based on the switching time of the data selector 3 and the processing time of the cyclic code check circuit 4. With this timing arrangement, it is possible to minimize the test time it takes to serially test the program data stored in the ROM 1.

The counter 2, the data selector 3, the cyclic code check circuit 4 and the check output control circuit 5 themselves are individually configured in a conventional manner. Further, the check output signal 110 is in serial form. Thus, hardware is less increased and only a small number of pins (terminals) necessary for test is needed.

Figure 4:
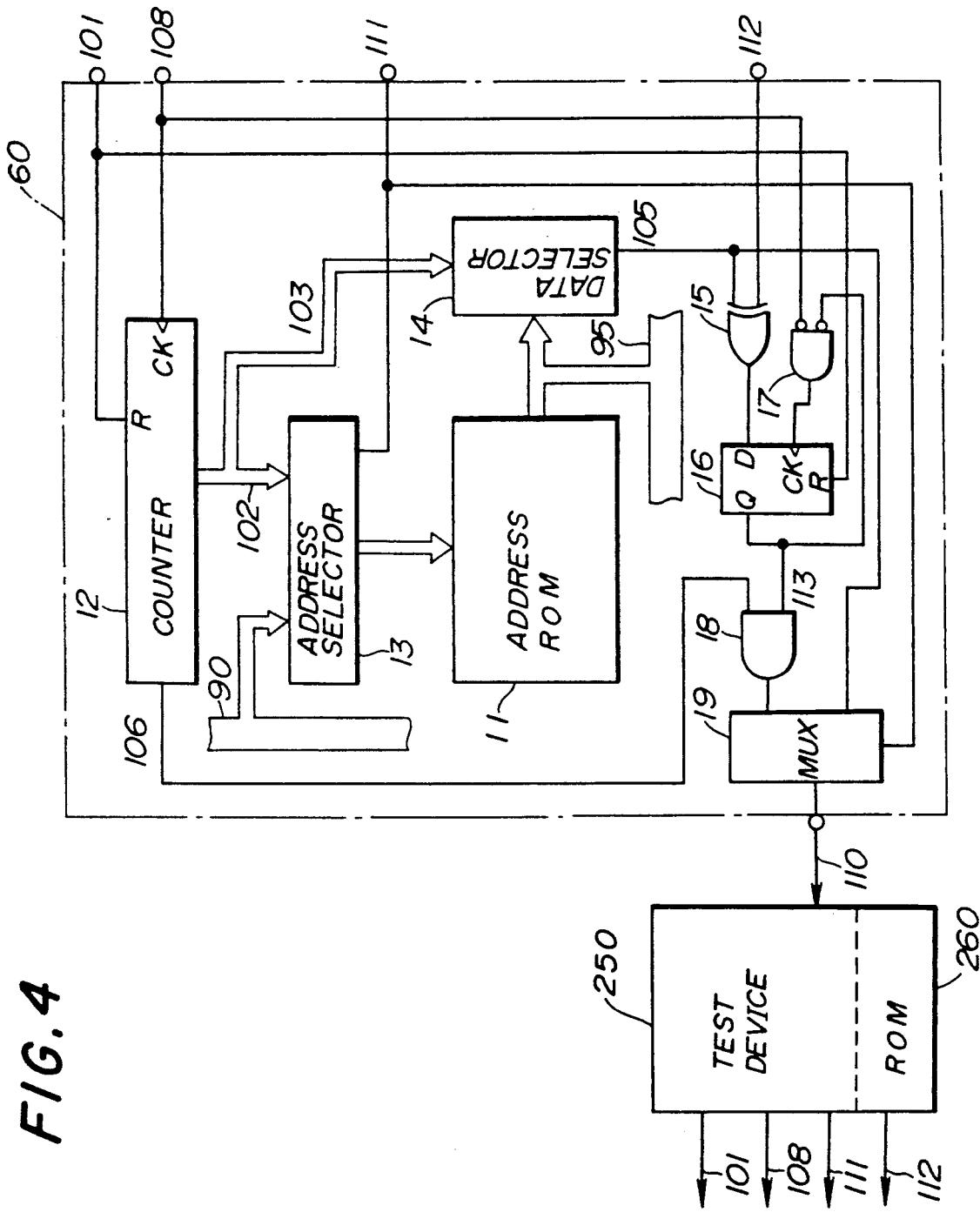
FIG. 4 is a block diagram of a ROM control device built in the information processing device according to a second embodiment of the present invention.

A description is given of the ROM control device 60 according to the second preferred embodiment of the present invention with reference to FIG. 4. The illustrated ROM control device 60 includes a ROM 11, a counter 12, an address selector 13, a data selector 14, an exclusive-OR gate (hereafter simply referred to as an EX-OR gate) 15, a D-type flip-flop 16, a NAND gate 17, an AND gate 19 and a multiplexer 19. The ROM 11, the counter 12 and the data selector 14 are the same as the corresponding elements shown in FIG. 2.

The address selector 13 selects either an address on the internal address bus 90 or the address signal 102 from the counter 12 on the basis of the status of a test mode switching signal 111 supplied from a test device 250. The selected address signal is supplied to the ROM 11. The data selector 14 converts parallel program data read out from the ROM 11 into serial program data 105 in response to the data select signal 103 which is a part of the address signal from the counter 12 as described previously with reference to FIG. 2.

The readout program data from the data selector 14 and an input signal (reference program data) 112 supplied from the test device 250 are applied to the EX-OR gate 15, an output signal of which is supplied to an input terminal D of the D-type flip-flop 16. An output signal drawn from an output terminal Q of the flip-flop 16 is applied to one of the two input terminals of the AND gate 18 and one of two input terminals of the NAND gate 17. The other input terminal of the NAND gate 17 is supplied with the counter clock 108 supplied from the test device 250. The output signal of the AND gate 18 is supplied to one of the two input terminals of the multiplexer 19, and the other input terminal thereof is supplied with the readout program data 105.

Figure 5:
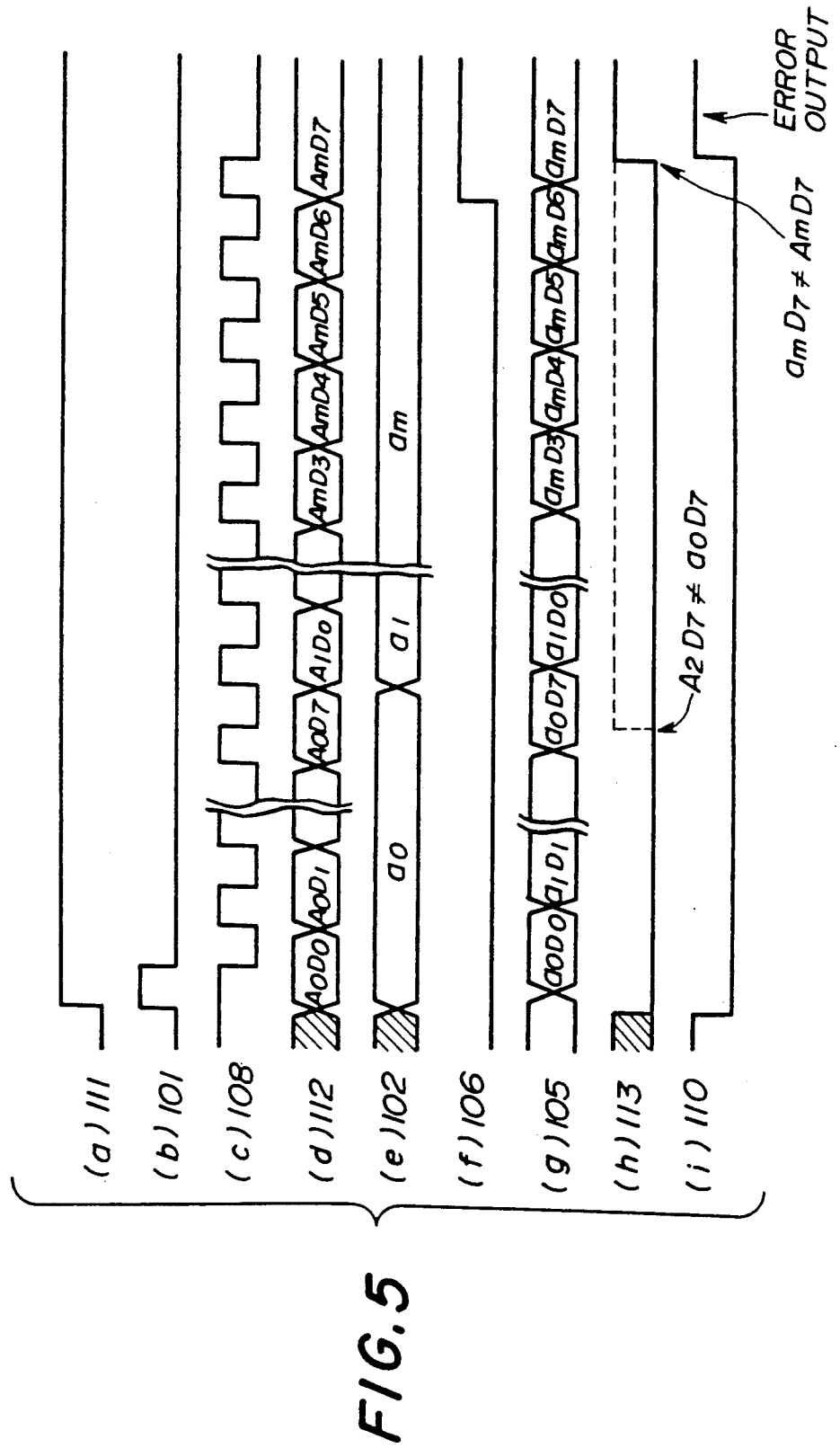
FIG. 5 is a time chart illustrating the operation of the ROM control device shown in FIG. 4.

A description is given of the operation of the ROM control device 60 (FIG. 4) with reference to FIG. 5.

When the test mode switching signal 11 is at a low level, the address selector 13 selects the address signal 114, and the multiplexer 19 selects the readout program data 105 from the data selector 4. At this time, no program data is read out from the ROM 11. Data on the internal data bus 95 passes through the data selector 14 and the multiplexer 19. As a result, it is possible to test the status of the internal data bus 95.

On the other hand, when the test mode switching signal 111 derived from the test device 250 is switched to a high level, the ROM control device 60 is switched to a ROM test mode. In this mode, the high-order address bits 102 from the counter 12 are supplied to the ROM 11 through the address selector 13, and the low-order address bits 103 are supplied to the data selector 14. In the ROM test mode, the multiplexer 19 selects the output from the AND gate 18. Subsequently, the test signal 101 is applied to the ROM control device 60 so that the counter 12 and the flip-flop 16 are reset. Thus, the address signal 102, the output signal 113 and the output signal 105 become zero.

In this state, the counter 12 is incremented by the counter clock 108 and corresponding program data is read out from the ROM 11. The readout program data in parallel form is converted into serial program data 105 through the data selector 14, and is then supplied to the EX-OR gate 15. At this time, reference program data which is read out from a ROM 260 of the test device 250 in synchronism with the counter clock 108 is applied, as the input signal 112, to the EX-OR gate 15. The EX-OR gate 15 compares the readout program data 105 from the data selector 14 with the reference program data 112 from the test device 250. When the two program data are identical to each other, the EX-OR outputs a low-level signal and thus the output terminal Q of the flip-flop 16 outputs a low-level signal. The low-level signal from the flip-flop 16 is applied to the NAND gate 17. Thus, the NAND gate 17 outputs a high-level signal to the clock terminal CK of the flip-flop 16 in synchronism with the low level of the counter clock 108.

In the above-mentioned manner, the readout program data 105 are successively compared with reference (correct) program data 112. When the readout program data 105 is not identical to the reference program data 112, the EX-OR gate 15 outputs a high-level signal, which is applied to the flip-flop 16. In a case where the ROM control device 60 is designed so that the readout program data 105 and the reference program data 112 have been settled when the counter clock 108 falls, the high-level signal input to the flip-flop 16 is held so that a high-level output is drawn from the output terminal Q of the flip-flop 16. As a result, the high-level signal is supplied to one of the two input terminals of the NAND gate 17, and the clock terminal CK of the flip-flop 16 is supplied with the low-level signal. As a result, the flip-flop 16 is successively disabled (made inactive) from now and on. In the disabled state, the output signal 113 from the output terminal Q of the flip-flop 16 is held at the high-level. After that, program data is continuously read out from the ROM 11. When the counter 12 overflows and outputs the overflow signal 106, the high-level signal from the AND gate 18 is output as the check result signal 110 from the multiplexer 19. It can be seen from the occurrence of the high-level check result signal 110 that an error is included in the program data stored in the ROM 11.

The present invention is not limited to the aforementioned embodiments, and variations and modifications may be made without departing from the scope of the present invention.

What is claimed is:

1. An information processing device comprising:
 a memory storing parallel program data;
 address generating means for generating a first address supplied to said memory and a second address;
 first conversion means for converting said parallel program data read out from said memory in accordance with said first address into serial program data when said second address generated by said address generating means is applied to said first conversion means; and
 second conversion means for converting said serial program data into a cyclic code signal and outputting said cyclic code signal to an external device in which said cyclic code signal is compared with a reference cyclic signal formed on the basis of correct program data corresponding to said program data stored in said memory.

2. An information processing device as claimed in claim 1, wherein said address generating means comprises overflow signal generating means for outputting an overflow signal to said second conversion means when all of said program data stored in said memory is read out therefrom in accordance with said first address supplied from said address generating means, and wherein said second conversion means outputs said cyclic code signal when said overflow signal is generated by said overflow signal generating means.

3. An information processing device as claimed in claim 1, wherein said address generating means comprises overflow signal generating means for outputting an overflow signal to said second conversion means when all of said program data stored in said memory is read out therefrom in accordance with said first address supplied from said address generating means, and wherein said second conversion means comprises holding means for holding said cyclic code signal when no overflow signal is supplied from said address generating means and for outputting said cyclic code signal when said overflow signal is supplied to said hold means from said address generating means.

4. An information processing device as claimed in claim 1, wherein said address generating means operates in synchronism with a first period of a clock signal, and said first and second conversion means operate in synchronism with a second period thereof which is shorter than said first period.

5. An information processing device as claimed in claim 1, wherein said address generating means generates a plurality of address bits, and wherein said first address is composed of a predetermined number of high-order bits among said address bits, and said second address is composed of the rest of said address bits.

6. An information processing device as claimed in claim 1, wherein said information processing device is a microcomputer.

7. An information processing device comprising:
 a memory storing parallel program data;
 address generating means for generating a first address supplied to said memory and a second address;
 conversion means for converting said parallel program data read out from said memory in accordance with said first address into serial program data when said second address generated by said address generating means is applied to said first conversion means;

compare means for comparing said serial program data with a reference program data supplied from an external device and outputting a comparison result when said serial program data is not identical to said reference program data; and output means for holding said comparison result until a test mode switching signal is supplied thereto from said external device and for outputting said comparison result when said test mode switching means is supplied.

8. An information processing device as claimed in claim 7, wherein said compare means comprises an exclusive-OR gate having a first input terminal supplied with said serial program data, a second input terminal supplied with said reference program data, and an output terminal, and wherein said output means comprises:

a flip-flop of the D type having an input terminal connected to the output terminal of said exclusive-OR gate, a clock terminal, a reset terminal supplied with a test signal, and an output terminal; and a NAND gate having a first input terminal supplied with a clock signal supplied from said external device, a second input terminal connected to said output terminal of said flip-flop, and an output terminal connected to said clock terminal of said flip-flop, said comparison result is drawn through said output terminal of said flip-flop.

9. An information processing device as claimed in claim 8, wherein said address generating means comprises overflow signal generating means for outputting an overflow signal to said second conversion means when all of said program data stored in said memory is read out therefrom in accordance with said first address supplied from said address generating means, and wherein said output means comprises an AND gate having a first input terminal supplied with said overflow signal, a second input signal connected to the output terminal of said flip-flop, and an output terminal through which said comparison result is drawn.

10. An information processing device as claimed in claim 7, wherein said information processing device comprises an internal data bus coupled to said conversion means so that said conversion means outputs either said serial program data or bus data on said internal data bus, and wherein said output means comprises selecting means for externally outputting said comparison result when a test mode signal from said external device is applied thereto and for externally outputting said bus data when no test mode signal from said external device is applied thereto.

11. An information processing device as claimed in claim 9, wherein said address generating means generates a plurality of address bits, and wherein said first address is composed of a predetermined number of high-order bits among said address bits, and said second address is composed of the remaining address bits.

12. An information processing device as claimed in claim 7, wherein said information processing device is a microcomputer.

* * * * *